United States Patent [19]

Chapin et al.

[11] Patent Number: 4,507,362

[45] Date of Patent: Mar. 26, 1985

[54] RESTORATIVE SPRAY COATING FOR INSULATED COPPER CONDUCTORS

[75] Inventors: John T. Chapin, Norcross; Raffaele A. Sabia, Atlanta, both of Ga.

[73] Assignee: AT&T Bell Laboratories, Murray Hill, N.J.

[21] Appl. No.: 541,056

[22] Filed: Oct. 12, 1983

[51] Int. Cl.³ .................... B32B 27/00; B32B 9/00; A21D 10/02; H01B 7/00
[52] U.S. Cl. ............................... 428/383; 428/389; 428/376; 428/380; 427/118; 427/409; 427/96; 174/120 R; 174/120 SR; 174/121 SR
[58] Field of Search ............ 428/375, 383, 389, 378, 428/379, 376; 174/120 R, 120 SR, 121 SR; 427/409, 118, 96

[56] References Cited

U.S. PATENT DOCUMENTS

| | | | |
|---|---|---|---|
| 1,896,040 | 1/1933 | Ruben | 427/118 |
| 1,896,041 | 1/1933 | Ruben | 428/389 |
| 1,896,042 | 1/1933 | Ruben | 428/389 |
| 1,896,043 | 1/1933 | Ruben | 427/118 |
| 2,370,046 | 3/1942 | Keyes | 427/118 |
| 3,228,899 | 1/1966 | Elmer | 260/19 |

OTHER PUBLICATIONS

"Copolymer 186–85", (Letter) *NL Chemicals*/NL Industries, Inc., Frank C. Naughton, Dir. of Mkt., Jun. 25, 1981.
"Driers and Metallic Soaps", *Encyclopedia of Chemical Technology*, Martin Grayson, Wiley Inter Science Pub., John Wiley & Sons, 1980, vol. 8, pp. 34–49.
Drying Oils", *Encyclopedia of Polymer Science and Technology*, Norman K. Bikales, Inter Science Pub., John Wiley and Sons, 1966, vol. 5, pp. 216–234.
"Copolymer 186 an Outstanding Dry Oil..", *The Baker Castor Oil Company, Technical Bulletin* 103-D, 1972, pp. 1–45.
"Gasproofing Tung Oil", *American Tung Oil Topics*, National Tung Oil Marketing Cooperative, Inc., Oct.-Nov. 1954, pp. 1–4.
"Castor Oils and Chemical Derivative", *The Baker Castor Oil Company, Technical Bulletin* 123, 1970, pp. 1–23.
"Drying Agents", *Encyclopedia of Chemical Technology*, Martin Grayson, Wiley–Interscience Pub., John Wiley and Sons, 1980, vol. 9, pp. 130–150.
"Fats and Fatty Oils", *Encyclopedia of Chemical Technology*, Martin Grayson, Wiley–Interscience Pub., John Wiley and Sons, 1980, vol. 9, pp. 796–830.

*Primary Examiner*—Marion E. McCamish
*Assistant Examiner*—Beverly K. Johnson
*Attorney, Agent, or Firm*—James H. Fox

[57] ABSTRACT

A varnish suitable for spray coating on plastic insulated copper conductors restores cracked or damaged insulation. The varnish cures by reaction in air upon application to the conductors. The varnish comprises drying oil (typically, tung oil and castor oil), phenolic resin, metallic catalysts, and solvents.

7 Claims, No Drawings

RESTORATIVE SPRAY COATING FOR INSULATED COPPER CONDUCTORS

BACKGROUND OF THE INVENTION

1. Field of the Invention

The present invention relates to a technique for re-insulating copper conductors having cracked and/or damaged insulation thereon.

2. Description of the Prior Art

There presently exists in telephone company outside plant installations a large amount of plastic insulated copper wire. Over a period of years the insulation on the wire may become cracked due to high temperatures, the presence of oxygen, and other environmental factors. In addition, it is frequently necessary to gain access to telephone conductors for testing purposes. This can result in damage to the insulation on conductors, especially in terminal housings and other access points. To protect and ensure the viability of this investment, restorative materials have been developed for repairing insulation on copper conductors.

Prior art restorative materials have included lacquers, typically applied in the form of a spray. This is in contrast to the frequent prior art use of varnishes for the original insulation of conductors in transformers, motors, etc. Varnishes are also used to preserve wood and other materials exposed to the atmosphere. However, varnishes are typically cured for relatively long periods, often at elevated temperatures, leading workers in the art to choose lacquers for restorative purposes. A lacquer is a material that dries due to the evaporation of a solvent, leaving behind a solid material. For this purpose, typically about a 3 weight percent polyurethane solid has been dissolved in 97 weight percent solvent. More recently, improved insulation sprays have comprised antioxidants to prolong the life of the insulation, typically polyethylene. The resulting insulation sprays typically comprise about 6 weight percent polyurethane and antioxidants in a solvent base. These materials dry to a film upon application in less than ten minutes under typical ambient conditions. However, these restorative materials have not proven entirely satisfactory, for a variety of reasons. In particular, the increase in service life of the reinsulated conductor has not been as great as desired, with cracks being developed in the reinsulated conductor after a few years time.

A variety of attributes are required for an effective reinsulation technique. A restorative material is desirably a material that is safe to handle, low in toxicity, and has the ability to reinsulate exposed copper conductors. It desirably can be delivered with a simple delivery system and should have good flow properties, which implies low viscosity, and it should be applicable over a wide temperature and humidity range. Furthermore, the system should not contain a solvent that can stress crack the plastic material present in associated connectors, plugs and/or terminal blocks. It should be non-corrosive, non-conductive, have low flammability, and be non-hygroscopic (i.e., does not absorb water). Finally, a reinsulation material should not unduly restrict subsequent re-entry of the wire bundle, but should have relatively low tear strength so that access to the copper conductor can be obtained in the future.

SUMMARY OF THE INVENTION

We have invented a restorative technique whereby a varnish material is applied to copper conductors having cracked and/or damaged insulation therein. The varnish includes as its components one or more drying oils, phenolic resin, one or more solvents, and one or more catalytic metallic salts. The formulation is typically applied by a spray system that avoids the use of a gaseous propellent in direct contact with the formulation.

DETAILED DESCRIPTION

The following detailed description relates to an improved restorative material for use with insulated copper wire. We have discovered that a significant problem with prior art restorative air dryed lacquers is that the high solvent-to-resin ratio promotes the formation of pinholes in the restorative material as it dries to a solid film on the insulated wire. These pin holes allow for corrosion of the underlying copper conductor as condensation of water vapor occurs. The present invention provides for the application of a varnish, rather than a lacquer. A varnish is a material that reacts with air to further polymerize the material, and does not rely entirely upon the evaporation of solvent for curing. This allows for a lower percentage of solvents in the formulation, since the unpolymerized solids have a lower viscosity before application than the solids typically employed in prior art lacquers. We have found that the higher solid-to-solvent ratio provides for improved performance of the reinsulation material. For purposes of clarification, the term "primary insulation" refers to the insulation placed on the copper conductor during manufacture of a wire or other article. The present technique provides for reinsulation of a conductor having discontinuous primary insulation thereon.

It is apparent that the above noted requirements place severe restriction on the choice of a suitable restorative material. In addition to the properties noted above, the material is desirably transparent upon curing to maintain the color code identification of the reinsulated wire, and should be effective over wires previously coated with lacquer. The choice of the reactants has been chosen to provide for a sufficiently fast curing speed for convenient application. However, it has surprisingly been found desirable to provide a slower drying rate than prior art lacquers, so that the material has sufficient time to penetrate cracked insulation. Thus, the curing of the present varnishes is in excess of one hour, but typically less than 10 hours at ambient temperature.

The basic formulation of the restorative material is listed in Table I below, with the weight percentages in the range indicated.

TABLE I

| Ingredient | Range (wt. %) |
| --- | --- |
| 1. Phenolic resin | 2–45 |
| 2. Drying Oil | 25–73 |
| 3. Solvents (Polar and Non-polar) | 25–75 |
| 4. Catalyst | 0.005–0.7 |
| 5. Cocatalyst (synergist) | 0.005–0.7 |
| 6. Plasticizer and other additives | 0–33 |

The phenolic resin imparts: (a) fast dry time. (b) chemical resistance and (c) oxidation resistance. A minimum level is required to provide an oxidative barrier for conductor insulation. Phenolic resins exhibiting softening points between 185 and 315 degrees F. are preferred.

The drying oil(s) impart: (a) flexibility, (b) toughness and (c) good adhesion to metals. Drying oil candidates include: cottonseed, dehydrated castor, linseed, oiticica, perilla, soybean and tung oils. Considering dry rate, performance and cost, tung oil and polymerized dehydrated castor oil are our preferred choices.

The solvents should include at least one polar type to provide for dissolution of the phenolic resin. Polar solvents having a "solubility parameter" in the resin of 8 to 13 are suitable; see *The Solubility of Non-Electrolytes*, Third Edition, J. H. Hildebrend et al, Reinfhold Publishing Corporation, New York (1950). A polar mineral spirit can provide for a single solvent in the formulation. In the examples herein, non-polar mineral spirits are used, thus requiring the addition of at least one polar solvent, typically comprising up to 10 weight percent of the formulation. The mineral spirits desirably conform to California "Rule 66" concerning the allowable limit of harmful volatiles. However, this is not required for otherwise successful formulations.

Catalyst and cocatalyst levels are dictated by: (a) dry rate and (b) performance (e.g., toughness, flexibility, chemical resistance). The following metallic salts are candidates: calcium, cerium, cobalt, copper, iron, lead, manganese, zinc and zirconium. Cobalt and zirconium metallic salts were employed in this work.

An oxidative stabilizer can be added to the formulation to provide an oxidative barrier. In place of natural drying oils, modified or synthetic oils such as alkyd resins can be employed. Similarly, a practitioner in the art can add plasticizers and other modifiers to modify the flexibility, toughness and other properties. The factors which govern compositional ranges are:

(1) Viscosity—highly viscous materials cannot be uniformly sprayed over the outdoor extremes in temperature, typically 35–120 degrees F.

(2) Dry time—material must flow and penetrate and encapsulate cracks. Choice of phenolic resin (softening point), drying oil type, catalysts and their concentrations, determine dry time.

(3) Mechanical properties of cured film—these are dictated by the choice of drying oil, level of phenolic resin and percent solids.

We have found that a solid-to-solvent concentration providing for at least 25 weight percent solids (i.e., less then 75 percent solvents) is desirable to reduce pinholes in the cured coating. This is a significantly higher solids concentration than in the prior art lacquers, as noted above. However, to provide for suitably low viscosity for ease of application, the solids concentration is typically less than 75 weight percent.

In view of these considerations, the presently preferred components and a preferred composition are given in Table II below.

TABLE II

| Ingredient | Concentration Preferred | (Wt. %) Range |
|---|---|---|
| 1. Phenolic resin | 18.4 | 2–45 |
| 2. Tung oil | 16.8 | 0–73 |
| 3. Partially polymerized, dehydrated castor oil | 9.8 | 0–73 |
| 4. Mineral spirits (Non-polar) | 50.2 | 25–75 |
| 5. Amyl acetate | 2.4 | 0–5 |
| 6. N—propanol | 2.4 | 0–5 |
| 7. Cobalt naphthenate | 0.0087 | 0.005–0.7 |
| 8. Zirconium aliphatic acids | 0.029 | 0.005–0.7 |

In this formulation, the tung oil and partially polymerized dehydrated castor oil represent the reactive drying oil components. These oils contain unsaturated fatty acid esters which react with atmospheric oxygen to form a cross-linked network. The reaction proceeds by a free radical process involving hydroperoxides and peroxides, which cleave to form ether and carbon-carbon bonds. The purpose of the metallic catalysts is to accelerate the cleavage of the peroxides. This leads to faster surface drying. Significantly, copper salts found on exposed wire in the field are effective catalysts for the varnish coating. The purpose of the phenolic resin is to provide durability, chemical resistance, improved drying time and anti-oxidant stability to the cured drying oil coating. The phenolic resin is a linear reaction product of a substituted phenol and formaldehyde. The hindered phenol structure of the product is similar to most of the common anti-oxidants found on the market; for example, butylated hydroxy toluene (BHT) and butylated hydroxy anisole (BHA). The amyl acetate and N-propanol are polar solvents for dissolving the phenolic resin, as noted above; other polar solvents are possible.

The formulation of these materials will be more fully explained by means of the following example.

EXAMPLE 1

A pyrex reaction kettle was preheated to 480 degrees F. using a silicon oil bath and a hot plate stirrer. Tung oil, (4.1 parts) phenolic resin (2.4 parts) and polymerized, dehydrated castor oil (CASTUNG 403 Z-3) (0.9 parts) were introduced while stirring. The solution was heated in air while monitoring the temperature and was maintained between 470–480 degrees F. The viscosity of the solution was noted by dipping a glass stirring rod into the solution and observing the drip rate. When the drip became elongated, typically at about 30–40 minutes, it was removed from the heat and the remaining polymerized, dehydrated castor oil (8.8 parts) was added to quench the reaction. To complete the preparation, the (12.8 parts) tung oil is added and then the phenolic resin solution (CKSA 2002 a Trademark of Union Carbide) (31.90 parts). Then the rule 66 mineral spirits (38.5 parts) are added to achieve a 45 weight percent solids ratio, and the metallic catalysts are added.

It is also possible to prepare the formulation by using a commercially pre-reacted dehydrated castor oil and unsaturated vegetable oil copolymer. This can then be blended with the remaining components at room temperature to yield the desired formulation. For this purpose a suitable pre-reacted material is Copolymer 186-85 marketed by CasChem, Incorporated, Bayonne, N.J. A suitable formulation using Copolymer 185-86 is given in Table III below.

TABLE III

| Ingredient | Range |
|---|---|
| 1. Copolymer 186-85 (Trademark of CasChem, Inc.) | 5–60% |
| *2. CKSA 2002 Resin solution | 4–50% |
| 3. Drying oil | 0–73% |
| 4. Mineral spirits | 25–75% |
| 5. Catalyst | 0.005–0.7% |
| 6. Cocatalyst | 0.005–0.7% |

*CKSA 2002 resin solution is a mixture of 50 weight percent Union Carbide CK 2400 phenolic resin, 35 weight percent mineral spirits, 7.5 weight percent amyl acetate, and 7.5 weight percent n-propanol.

A preferred composition using Copolymer 186-85 is given in Table IV below.

TABLE IV

| Ingredient | Concentration |
| --- | --- |
| 1. Copolymer 186-185 | 19.1% |
| 2. CKSA2002 | 31.9% |
| 3. Tung oil | 12.8% |
| 4. Mineral spirits | 35.6% |
| 5. Nuodex Naphthenate (Trademark of Tenneco Chemical Co. for 6% cobalt catalyst) | 0.145% |
| 6. NuXtra acids solution (Trademark of Tenneco Chemical Co. for 6% zirconium synergist) | 0.486% |

A suitable method of preparing a formulation based upon this preferred composition is given in Example II below.

EXAMPLE II

Charge 31.9 parts CKSA 2002 resin solution into an open or closed reaction vessel maintain at room temperature (23±3 degrees C.) and outfitted with nitrogen or argon purging. Next, add 19.1 parts Copolymer 186-85 and 12.8 parts of tung oil with stirring. After allowing sufficient time for complete mixing, add 0.145 parts Nuodex cobalt naphthenate and 0.483 parts NuXtra zirconium aliphatic acids solution. Rule 66 mineral spirits are then added to the stirred solution to achieve the desired percent solids 40–50 cps at 72 degrees F. and the viscosity range specified (40–50 cps at 72 degrees F.). A variety of tests were performed on the above noted formulation of Table IV to determine its suitability as a restorative material for copper conductors having cracked insulation. In a water immersion test, badly cracked and twisted polyethylene insulated copper conductors were sprayed with the above noted formulation and immersed in tap water for one week under a potential of 48 volts. The restored conductors maintained insulation resistance of over $10^6$ ohms. In a second test, a set of coated cracked and twisted wires as coated above were exposed to a fog environment at 135 degrees F. for one week under a 48 volt potential maintained between the wires. The resistance was found to remain above $10^6$ ohms. In a third test, a set of the above noted wires were exposed to forced oven aging at 90 degrees C., with the resistance being measured at one week intervals under tap water. The insulation between the wires remained at above $10^7$ ohms for a period of 7 weeks. We estimate that the performance of the preferred composition in Table II is substantially equivalent to the material of Table IV. We further estimate that the preferred concentrations in Table II can be varied at least plus or minus 10 percent and still give comparable results.

It has been found that the low viscosity and reactivity of the formulation allows it to penetrate cracks in the insulation and seal them during air curing. The coating has excellent adhesion to copper, reinforcing the role of copper salts as catalysts for the curing reaction. Field experiments have shown that delivering the varnish in an air-free packaged environment should be provided. This is because air in the solution leads to particulate formation, nozzle clogging, and gelation of the solution. Furthermore, normal aerosol cans cannot deliver the formulation without foaming, as the viscosity is typically above 45 centipoise. This is because typical aerosol solutions are heavily loaded with the propellant, and foaming occurs as the propellant decompresses from the spray.

Therefore, the inventive formulation is desirably delivered in an aerosol spray can with an inner plastic bag containing the coating formulation. The propellant is then injected in the space within the can surrounding the outside of the bag. This design allows spraying from any orientation and prevents combination of the propellant with the inventive formulation. In typical applications, a drying time of 2 to 6 hours is satisfactory for an ambient temperature from 35–120 degrees F., thus covering most environments encountered in the field.

Copper wire having polyethylene, polypropylene, or other types of plastic insulation thereon can advantageously be restored by the present technique. In addition, wood pulp insulated wire can be similarly treated, typically to restore insulation that has frayed after extended exposure to low humidity environments. Also, the present technique includes the insulation of copper conductors on printed circuit boards. Such conductors may be coated during the manufacture of the board by acrylics, silicones, or other prior art materials. The present technique can then be used for re-insulation to correct for cracked or damaged insulation, as can occur during repair of the board, or otherwise. It can also advantageously be used for repairing the insulation on connectors, terminal blocks, and other articles comprising copper conductors, as will be apparent to workers in the art.

What is claimed is:

1. A copper conductor having a cracked and/or damaged discontinuous primary insulation thereon characterized in that said discontinuous primary insulation has coated thereon a formulation comprising: (A) 2 to 45 weight percent phenolic resin; (B) 25 to 73 total weight percent of at least one oil selected from the group consisting of tung oil and dehydrated castor oil; (C) 25 to 75 weight percent solvent; and (D) 0.01 to 1.4 weight percent metallic catalysts and cocatalysts.

2. The conductor of claim 1 wherein the total amount of solvents is less than 75 weight percent of said formulation.

3. The conductor of claim 2 wherein said formulation comprises approximately: (A) 18.4 weight percent phenolic resin; (B) 16.9 weight percent tung oil; (C) 9.8 weight percent partially polymerized dehydrated castor oil; (D) 50 weight percent mineral spirits; (E) 2.4 weight percent amyl acetate; (F) 2.4 weight percent N-propanol; (G) 0.0087 weight percent cobalt naphthenate; and (H) 0.029 weight percent zirconium aliphatic acids.

4. A method of restoring a copper conductor having cracked and/or damaged discontinuous insulation thereon characterized by applying to said discontinuous insulation a formulation comprising: (A) 2 to 45 weight percent phenolic resin; (B) 25 to 73 weight percent of at least one drying oil; (C) 25 to 75 weight percent of at least one solvent; and (D) 0.01 to 1.4 weight percent metallic catalysts and cocatalysts.

5. The method of claim 4 wherein said formulation is applied by spraying onto said conductor.

6. The method of claim 4 wherein said insulation is selected from the group consisting of polyethylene or polypropylene.

7. The method of claim 4 wherein said conductor is on a printed circuit board.

* * * * *